United States Patent
Nishikawa et al.

(10) Patent No.: US 9,134,740 B2
(45) Date of Patent: Sep. 15, 2015

(54) LOW DROPOUT REGULATOR HAVING DIFFERENTIAL CIRCUIT WITH X-CONFIGURATION

(71) Applicant: KABUSHIKI KAISHA TOSHIBA, Minato-ku, Tokyo (JP)

(72) Inventors: Ichiro Nishikawa, Kanagawa-ken (JP); Yuichi Goto, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 166 days.

(21) Appl. No.: 13/931,347

(22) Filed: Jun. 28, 2013

(65) Prior Publication Data

US 2014/0210435 A1 Jul. 31, 2014

(30) Foreign Application Priority Data

Jan. 28, 2013 (JP) ................. P2013-012933

(51) Int. Cl.
*G05F 1/56* (2006.01)
*G05F 1/46* (2006.01)
*G05F 1/575* (2006.01)
*H03F 3/00* (2006.01)

(52) U.S. Cl.
CPC *G05F 1/468* (2013.01); *G05F 1/56* (2013.01); *G05F 1/575* (2013.01); *H03F 3/00* (2013.01)

(58) Field of Classification Search
CPC .............. G05F 1/46; G05F 1/56; G05F 1/575
USPC .................. 323/273, 274, 275, 279, 280, 315
See application file for complete search history.

(56) References Cited

U.S. PATENT DOCUMENTS

| 7,492,137 | B2 | 2/2009 | Yamada |
| 7,612,548 | B2 | 11/2009 | Jian |
| 8,981,747 | B2 | 3/2015 | Saito et al. |
| 2009/0121693 | A1* | 5/2009 | Noda ............................ 323/273 |
| 2013/0249294 | A1 | 9/2013 | Saito et al. |
| 2014/0253070 | A1* | 9/2014 | Sakaguchi .................... 323/273 |

FOREIGN PATENT DOCUMENTS

| JP | 2004240646 | 8/2004 |
| JP | 2012016123 | 1/2012 |

* cited by examiner

*Primary Examiner* — Gary L Laxton
*Assistant Examiner* — Kyle J Moody
(74) *Attorney, Agent, or Firm* — White & Case LLP

(57) ABSTRACT

A regulator includes a first transistor, a first bias circuit, a second bias circuit, a differential circuit having second to fifth transistors, and a current mirror circuit. The first transistor outputs an output voltage lower than the input voltage. The first bias circuit generates a first bias voltage lower than a reference voltage. The second bias circuit generates a second bias voltage lower than a feedback voltage relating to the output voltage. The second transistor into which the reference voltage is inputted and the third transistor into which the feedback voltage is inputted are a pair of differential transistors. The fourth transistor is complementarily connected to the second transistor. The fifth transistor is complementarily connected to the third transistor. The differential circuit outputs a comparison signal to the first transistor. The current mirror circuit is connected to the second and third transistors.

20 Claims, 14 Drawing Sheets

LOW DROPOUT REGULATOR HAVING DIFFERENTIAL CIRCUIT WITH X-CONFIGURATION

CROSS REFERENCE TO RELATED APPLICATION

This application is based upon and claims the benefit of priority from the prior Japanese Patent Application No. 2013-012933, filed on Jan. 28, 2013, the entire contents of which are incorporated herein by reference.

FIELD

Embodiments described herein generally relate to a regulator.

BACKGROUND

A regulator includes a differential circuit. The differential circuit compares an output voltage with a reference voltage to feed the comparison result back to an output transistor.

Accordingly, the output voltage becomes equal to the reference voltage.

In the background art, the differential circuit includes a pair of differential transistors to operate with constant current, a current source to drive differential transistors, and a current mirror circuit to balance driving currents of the differential transistors.

The regulator has a response speed depending on an operation speed of the differential circuit. The larger the driving current is, the higher the operation speed of the differential circuit is.

Accordingly, the differential circuit should operate with a large current all of the time in order to prevent a variation in the output voltage due to a sudden change in a load.

Unfortunately, the large current increases the power consumption of the regulator. In addition, an integrated circuit that includes a regulator and operates with low voltage can pose a drawback for the operation of the integrated circuit due to heat generation in the regulator by the increased power consumption.

BRIEF DESCRIPTION OF THE DRAWINGS

The accompanying drawings, which are incorporated in and constitute a part of this specification, illustrate embodiments of the invention and together with the description, serve to explain the principles of the invention.

DETAILED DESCRIPTION

Figure 1:
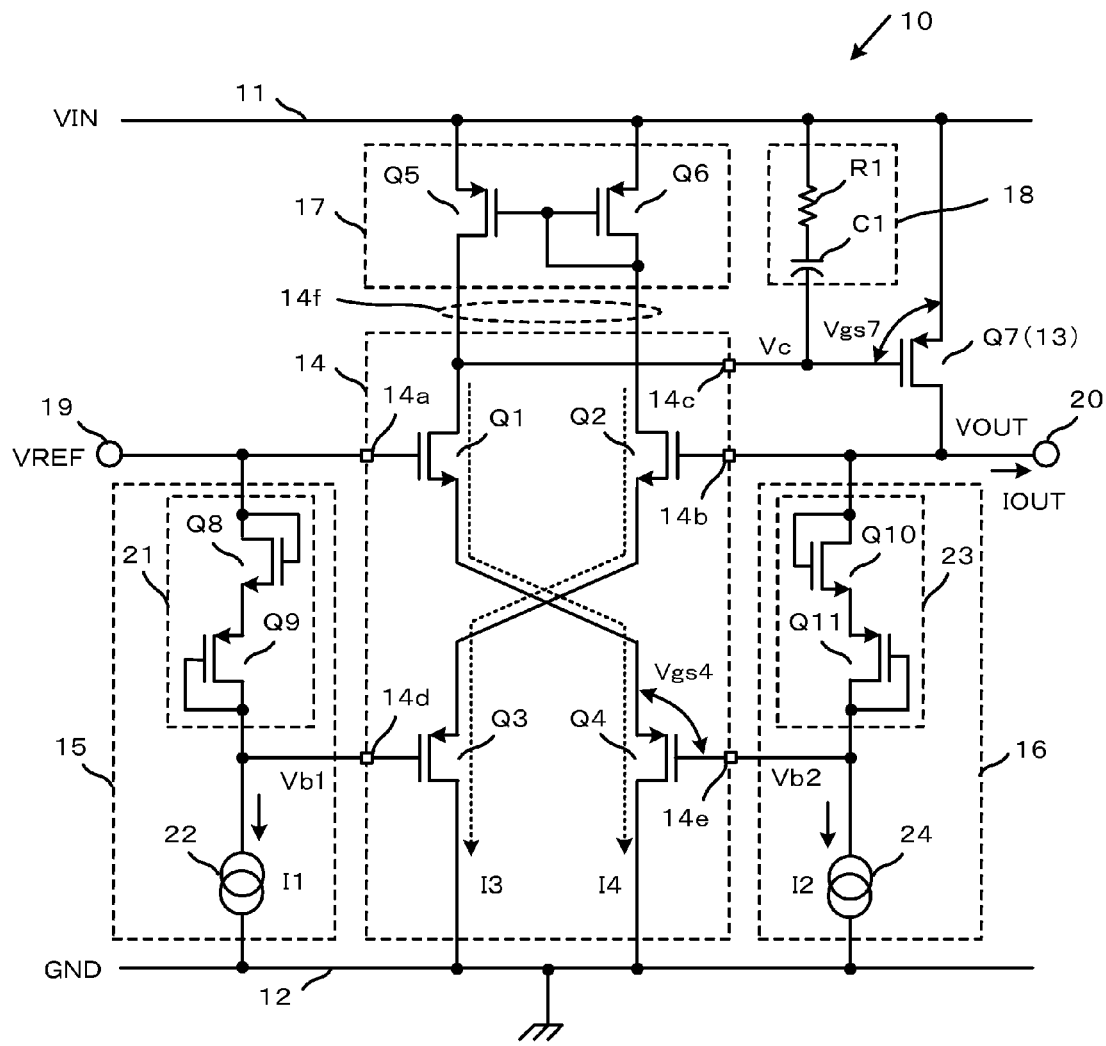
FIG. 1 shows a circuit diagram of a regulator in accordance with a first embodiment.

According to an embodiment, a regulator includes a first transistor, a first bias circuit, a second bias circuit, a differential circuit having second to fifth transistors, and a current mirror circuit. The first transistor with a first control electrode outputs an output voltage by converting an input voltage into the output voltage lower than the input voltage. The first bias circuit generates a first bias voltage lower than a reference voltage. The second bias circuit generates a second bias voltage lower than a feedback voltage relating to the output voltage. The second transistor of a second conductivity type has a second control electrode to which the reference voltage is inputted into the second control electrode. The third transistor of the second conductivity type with a third control electrode and the second transistor are a pair of differential transistors. The feedback voltage is inputted into the third control electrode. The fourth transistor with a fourth control electrode is complementarily connected to the second transistor. The second bias voltage is inputted into the fourth control electrode. The fifth transistor with a fifth control electrode is complementarily connected to the third transistor. The first bias voltage is inputted into the fifth control electrode. The differential circuit outputs a comparison signal as a control signal to the first control electrode in accordance with a difference between the reference voltage and the output voltage. The current mirror circuit is connected to the second and third transistors.

Hereinafter, embodiments will be described with reference to the drawings. In the drawings, same reference characters denote the same or similar portions.

First Embodiment

A regulator in accordance with a first embodiment will be described with reference to FIG. 1, FIGS. 2A to 2G, and FIGS. 3A to 3G. FIG. 1 is a circuit diagram showing a regulator in accordance with a first embodiment. FIGS. 2A to 2G make up a timing chart for describing the operation of the regulator when a load increases. FIGS. 3A to 3G make up a timing chart for describing the operation of the regulator when the load decreases.

As shown in FIG. 1, a regulator 10 of the embodiment is a low dropout regulator (LDO) employing an insulated gate field effect transistor.

In the specification, the insulated gate field effect transistor is referred to as a MOS transistor, a p-channel (a first conductivity type) MOS transistor is referred to as a PMOS transistor, and an n-channel (a second conductivity type) MOS transistor is referred to as a NMOS transistor.

The regulator 10 is connected to a power-supply line 11 (a high voltage line) having an input voltage VIN and a grounding line 12 (a low voltage line). The regulator 10 includes an output circuit 13, a differential circuit 14, a first bias circuit 15, and a second bias circuit 16.

The output circuit 13 converts an input voltage VIN into an output voltage VOUT in accordance with a control signal Vc to output the output voltage VOUT lower than the input voltage VIN. The differential circuit 14 compares the output voltage VOUT to the reference voltage VREF to feed the control signal Vc back to the output circuit 13 in accordance with the comparison result.

The first bias circuit 15 performs a level shift of the reference voltage VREF to output a first bias voltage Vb1 to the differential circuit 14. The second bias circuit 16 performs a level shift of the output voltage VOUT to output a second bias voltage Vb2 to the differential circuit 14.

The regulator 10 further includes a current mirror circuit 10 for causing an operating current to flow into the differential circuit 14 and a phase compensation circuit 18 for improving a high-frequency property of the regulator 10.

The reference voltage VREF is inputted into a reference-voltage input terminal 19, and the output voltage VOUT is outputted to a voltage output terminal 20. A load RL (not shown) is connected between the voltage output terminal 20 and the grounding line 12. An output capacitor Cout (not shown) may be connected between the voltage output terminal 20 and the grounding line 12.

Configurations of the respective circuits will be described below. The output circuit 13 includes a PMOS transistor (a first transistor) Q7. The source electrode of the PMOS transistor Q7 is connected to a power-supply line 11, the drain electrode thereof is connected to the voltage output terminal 20, and the gate electrode (a first control electrode) thereof is connected to an output terminal 14c.

The differential circuit 14 includes a non-inverting input terminal 14a, an inverting input terminal 14b, the output terminal 14c, a first bias input terminal 14d, and a second bias input terminal 14e.

The differential circuit 14 further includes an NMOS transistor (a second transistor) Q1 and another NMOS transistor (a third transistor) Q2 being a pair of differential transistors, a PMOS transistor (a fourth transistor) Q4, and another PMOS transistor (a fifth transistor) Q3. The PMOS transistor Q4 is complementarily connected to the NMOS transistor Q1, and the PMOS transistor Q3 is complementarily connected to the NMOS transistor Q2.

The source electrode of the NMOS transistor Q1 is connected to the source electrode of the PMOS transistor Q4. The source electrode of the NMOS transistor Q2 is connected to the source electrode of the PMOS transistor Q3.

The gate electrode (a second control electrode) of the NMOS transistor Q1 is connected to the non-inverted terminal 14a. The gate electrode (a third control electrode) of the NMOS transistor Q2 is connected to the non-inverted terminal 14b. The drain electrode of the NMOS transistor Q1 is connected to the output terminal 14c.

The gate electrode (a fifth control electrode) of the PMOS transistor Q3 is connected to the first bias input terminal 14d. The gate electrode (a fourth control electrode) of the PMOS transistor Q4 is connected to the second bias input terminal 14e.

The drain electrode of the PMOS transistor Q3 and the drain electrode of the PMOS transistor Q4 are connected to the grounding line 12.

The reference voltage VREF is inputted into the non-inverting input terminal 14a, the output voltage VOUT is inputted into the inverting input terminal 14b, and the control signal Vc is outputted from the output terminal 14c.

The first bias circuit 15 is connected between the reference-voltage input terminal 19 and the grounding line 12 to output the first bias voltage Vb1 to the first bias input terminal 14d. The first bias circuit 15 includes a first level-shift circuit 21 and a first current supply 22 for supplying current to the first level-shift circuit 21.

The first level shift circuit 21 is a series circuit of a NMOS transistor Q8 and a PMOS transistor Q9. Both the drain electrode and the gate electrode of the NMOS transistor Q8 are connected to each other (diode-connected). Both the drain electrode and the gate electrode of the PMOS transistor Q9 are connected to each other.

The second bias circuit 16 is connected between the voltage output terminal 20 and the ground line 12 to output the second bias voltage Vb2 to the second bias input terminal 14e. The second bias circuit 16 includes a second level-shift circuit 23 and a second current supply 24 for supplying current to the second level-shift circuit 23.

The second level-shift circuit 23 is a series circuit of a NMOS transistor Q10 and a PMOS transistor Q11. Both the drain electrode and the gate electrode of the NMOS transistor Q10 are connected to each other (diode-connected). Both the drain electrode and the gate electrode of the PMOS transistor Q11 are connected to each other.

The current mirror circuit 17, which includes a PMOS transistor Q5 and a PMOS transistor Q6, is connected between a power-supply line 11 and a differential amplifier circuit 14. The two gate electrodes of the PMOS transistors Q5 and Q6 are connected to each other.

The source electrode and the drain electrode of the PMOS transistor Q5 are connected to the power-supply line 11 and the drain electrode of an NMOS transistor Q1, respectively. The source electrode of the PMOS transistor Q6 is connected to the power-supply line 11. The drain electrode of the PMOS transistor Q6 is connected to the gate electrode of the PMOS transistor Q6 and the drain electrode of the NMOS transistor Q2.

The two signal paths connecting the current mirror circuit 17 with the two drain electrodes of the pair of NMOS transistors Q1 and Q2 are comprehensively referred to as a pair of differential output lines 14f.

A phase control circuit 18 with a resistance R1 and a capacitor C1 connected in series is connected between the power-supply line 11 and the gate electrode of the PMOS transistor Q7. The phase control circuit 18 is a highpass filter having a cutoff frequency of $1/(2\pi\sqrt{C1R1})$.

The performance of each circuit will be described. In the first bias circuit 15, an idling current I1 flows from a first current supply 22 on a steady bias. The first level-shift circuit 21 shifts a level of the reference voltage VREF by the sum of threshold values Vth8 and Vth9 that are of the NMOS transistor Q8 and the PMOS transistor Q9, respectively.

The first bias voltage Vb1 is therefore expressed by VREF−(Vth8+Vth9). Since the reference voltage VREF is constant, the first bias voltage Vb1 is also constant in the same way as the reference voltage VREF.

In the second bias circuit 16, an idling current I2 flows from the second current supply 24 on a steady basis. The second level-shift circuit 23 shifts a level of the output voltage VOUT by the sum of threshold values Vth10 and Vth11 that are of the NMOS transistor Q10 and the PMOS transistor Q11, respectively.

The second bias voltage Vb2 is therefore expressed by VOUT−(Vth10+Vth11). Variations in the output voltage VOUT cause the second bias voltage Vb2 to vary in the same way.

In the differential circuit 14, the PMOS transistor Q3 is operable as a current supply to determine an operating current I3 of the NMOS transistor Q2 in accordance with the first bias voltage Vb1. The PMOS transistor Q4 is operable as a current supply to determine an operating current I4 of the NMOS transistor Q1 in accordance with the first bias voltage Vb2.

The idling current I1 and the idling current I2 are set equal to each other (I1=I2). The idling current I1 is needed just for the operation of the first level-shift circuit 21. In the same way, the idling current I2 is needed just for the operation of the second level-shift circuit 23.

The operating currents I3 and I4 are equal to each other in a steady state where the reference voltage VREF and the output voltage VOUT are equal to each other (I3=I4). The idling currents I1 and I2 are much smaller than the operating currents I3 and I4.

In the regulator 10 of the embodiment, the differential circuit 14 includes an X-configuration, such that the two sources of the NMOS transistor Q1 and the PMOS transistor Q4 are connected to each other, and the two sources of the NMOS transistor Q2 and the PMOS transistor Q3 are connected to each other. In addition, the gate electrodes of the NMOS transistor Q1 and the PMOS transistor Q3 are connected to each other via the first level-shift circuit 21, and the gate electrodes of the NMOS transistor Q2 and the PMOS transistor Q4 are connected to each other via the second level-shift circuit 23.

The respective operating currents of the NMOS transistors Q1 and Q2 depend on both the reference voltage VREF and the output voltage VOUT.

Operation of the regulator 10 will be described with reference to FIGS. 2A to 2G, and FIGS. 3A to 3G. In FIGS. 2A to 2G and FIGS. 3A to 3G, the horizontal axis denotes time, and the vertical axis denotes voltage or current. A first steady state is shown to the time t1 on the horizontal axis, where the reference voltage VREF is equal to the output voltage VOUT. A transient state is shown from the time t1 to the time t2, where the output voltage VOUT varies with a variation in the load. A second steady state is shown on and after the time t2, where the output voltage VOUT is equal to the output voltage VOUT.

The vertical axes in sequence denote an output current IOUT, the output voltage VOUT, a gate-source voltage Vgs4 of the PMOS transistor Q4, a drain current Ids4 of the PMOS transistor Q4, a drain current Ids3 of the PMOS transistor Q3, a gate-source voltage Vgs7 of the PMOS transistor Q7 and a drain current Ids7 of the PMOS transistor Q7.

The regulator 10 outputs the output voltage VOUT, which is equal to the reference voltage VREF, to the voltage output terminal 20, so that the output current IOUT flows into the load RL.

The operation in the first and second steady states will be described as follows. The respective gate-source voltages and drain currents of the NMOS transistors Q1, Q2, Q8, Q10, and the PMOS transistors Q3 to Q6, Q9, and Q11 are constant. The gate-source voltage Vgs7 of the PMOS transistor Q7 and drain current Ids7 of the PMOS transistor Q7 are determined by a load.

The operation of the regulator 10 in the transient state will be described as follows. A first case will be described below. The first case is that the load rapidly increases to increase the output current IOUT.

Figure 2:
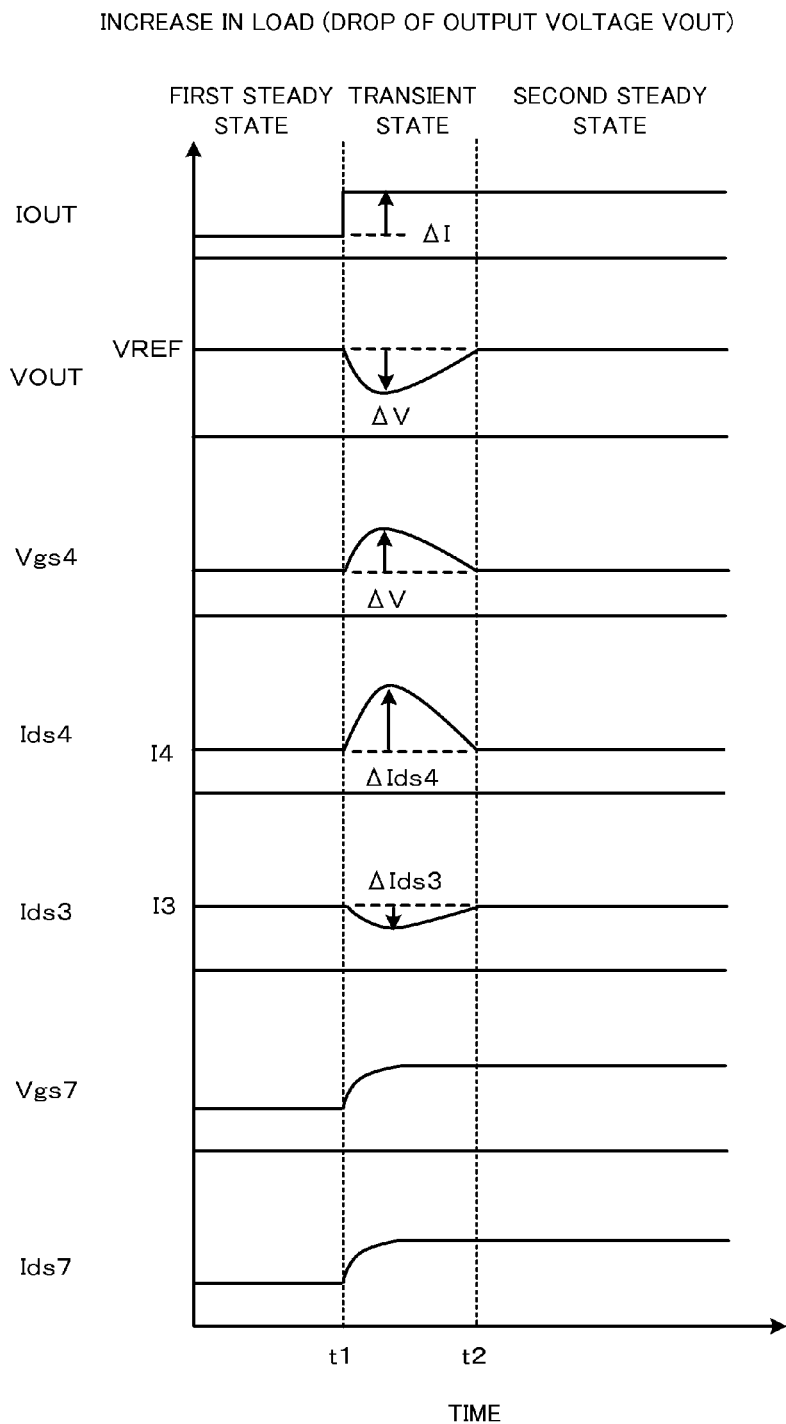
FIGS. 2A to 2G make up a timing chart for explaining operation of the regulator in accordance with the first embodiment.

As shown in FIG. 2A, an initial condition is that the output current IOUT increases by ΔI in a stepwise manner as a result of the rapid increase in the load at the time t1.

As shown in FIG. 2B, the rapid increase in the output current IOUT causes a voltage drop inside the regulator 10 as a result of a finite response speed of the regulator 10, so that the output voltage VOUT starts to decrease. The second bias voltage Vb2 of the second bias circuit 16 decreases in accordance with the decrease in the output voltage VOUT.

As shown in FIG. 2C, the decrease in the second bias voltage Vb2 increases the gate-source voltage Vgs4 of the PMOS transistor Q4.

As shown in FIG. 2D, the increase in the gate-source voltage Vgs4 increases the drain current Ids4 of the PMOS transistor Q4. The increase in the drain current Ids4 decreases the ON resistance of the PMOS transistor Q4.

This suggests that a current is allowed to be extracted through the NMOS transistor Q1 of the differential pair without limitations by the idling current I2.

As shown in FIG. 2E, the decrease in the output voltage VOUT decreases the gate-source voltage Vgs2 of the NMOS transistor Q2 of the differential pair, i.e., the gate-source voltage Vgs3 of the NMOS transistor Q3, leading to a decrease in the drain current Ids3.

The current mirror circuit 17 is operable to make a current (input current) through the PMOS transistor Q6 and a current (output current) through the PMOS transistor Q5 equal to each other. As a result, the increase in the drain current Ids4 and the decrease in the drain current Ids3 cause electric charges accumulated in the gate capacitor of the PMOS transistor Q7, i.e., an output transistor, to be rapidly extracted as to compensate the difference between the drain current Ids4 and the drain current Ids3. This extraction of the charges decreases the voltage of the output terminal 14c.

As shown in FIG. 2F, the decrease in the voltage of the output terminal 14c increases the gate-source voltage Vgs7 of the PMOS transistor Q7.

As shown in FIG. 2G, the increase in the gate-source voltage Vgs7 increases the drain current Ids7 of the PMOS transistor Q7. As a result, the output voltage VOUT goes out of the decrease and into the increase to reach the reference voltage VREF at the time t2.

A second case will be described below. The second case is that the load rapidly decreases to decrease the output current IOUT. The second case is basically opposite to the first case described with reference to FIGS. 2A to 2G.

Figure 3:
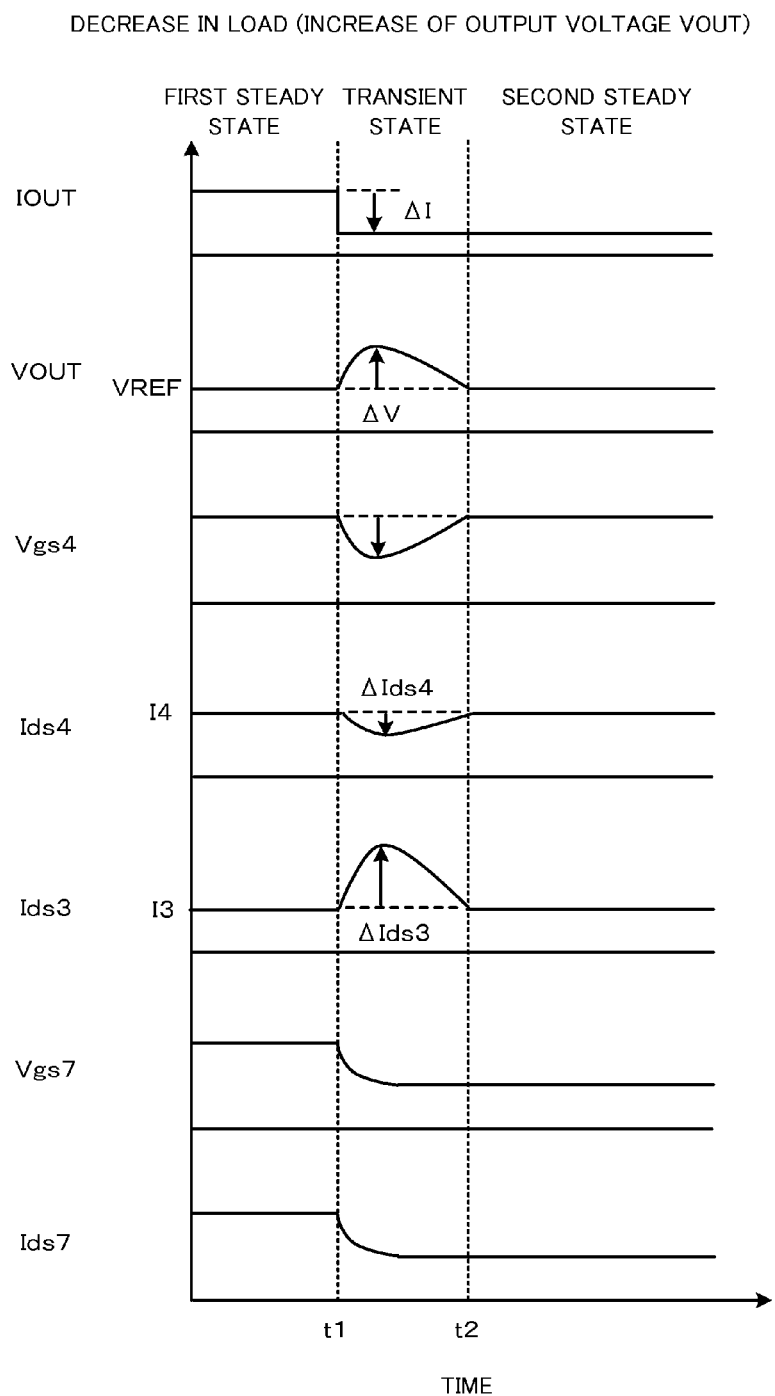
FIGS. 3A to 3G make up a timing chart for explaining operation of the regulator in accordance with the first embodiment.

As shown in FIG. 3A, an initial condition is that the output current IOUT decreases by ΔI in a stepwise manner as a result of the rapid decrease in the load at the time t1.

As shown in FIG. 3B, the rapid decrease in the output current IOUT causes a voltage drop inside the regulator 10 to decrease as a result of a finite response speed of the regulator 10, so that the output voltage VOUT starts to increase. The second bias voltage Vb2 of the second bias circuit 16 increases in accordance with the increase in the output voltage VOUT.

As shown in FIG. 3C, the increase in the second bias voltage Vb2 decreases the gate-source voltage Vgs4 of the PMOS transistor Q4.

As shown in FIG. 3D, the decrease in the gate-source voltage Vgs4 decreases the drain current Ids4 of the PMOS transistor Q4. The decrease in the drain current Ids4 increases the ON resistance of the PMOS transistor Q4.

As shown in FIG. 3E, the increase in the output voltage VOUT increases the gate-source voltage Vgs2 of the NMOS transistor Q2 of the differential pair, i.e., the gate-source voltage Vgs3 of the NMOS transistor Q3, leading to the increase in the drain current Ids3.

This suggests that a current is allowed to be extracted through the NMOS transistor Q2 of the differential pair without limitations by the idling current I1.

The current mirror circuit 17 is operable to make a current (input current) through the PMOS transistor Q6 and a current (output current) through the PMOS transistor Q5 equal to each other. As a result, the decrease in the drain current Ids4 and the increase in the drain current Ids3 cause electric charges to be rapidly accumulated in the gate capacitor of the PMOS transistor Q7 as to compensate the difference between the drain current Ids4 and the drain current Ids3. This accumulation of the charges increases the voltage of the output terminal 14c.

As shown in FIG. 3F, the increase in the voltage of the output terminal 14c decreases the gate-source voltage Vgs7 of the PMOS transistor Q7.

As shown in FIG. 3G, the decrease in the gate-source voltage Vgs7 decreases the drain current Ids7 of the PMOS transistor Q7. As a result, the output voltage VOUT goes out of the increase and into the decrease to reach the reference voltage at the time t2.

Figure 4:
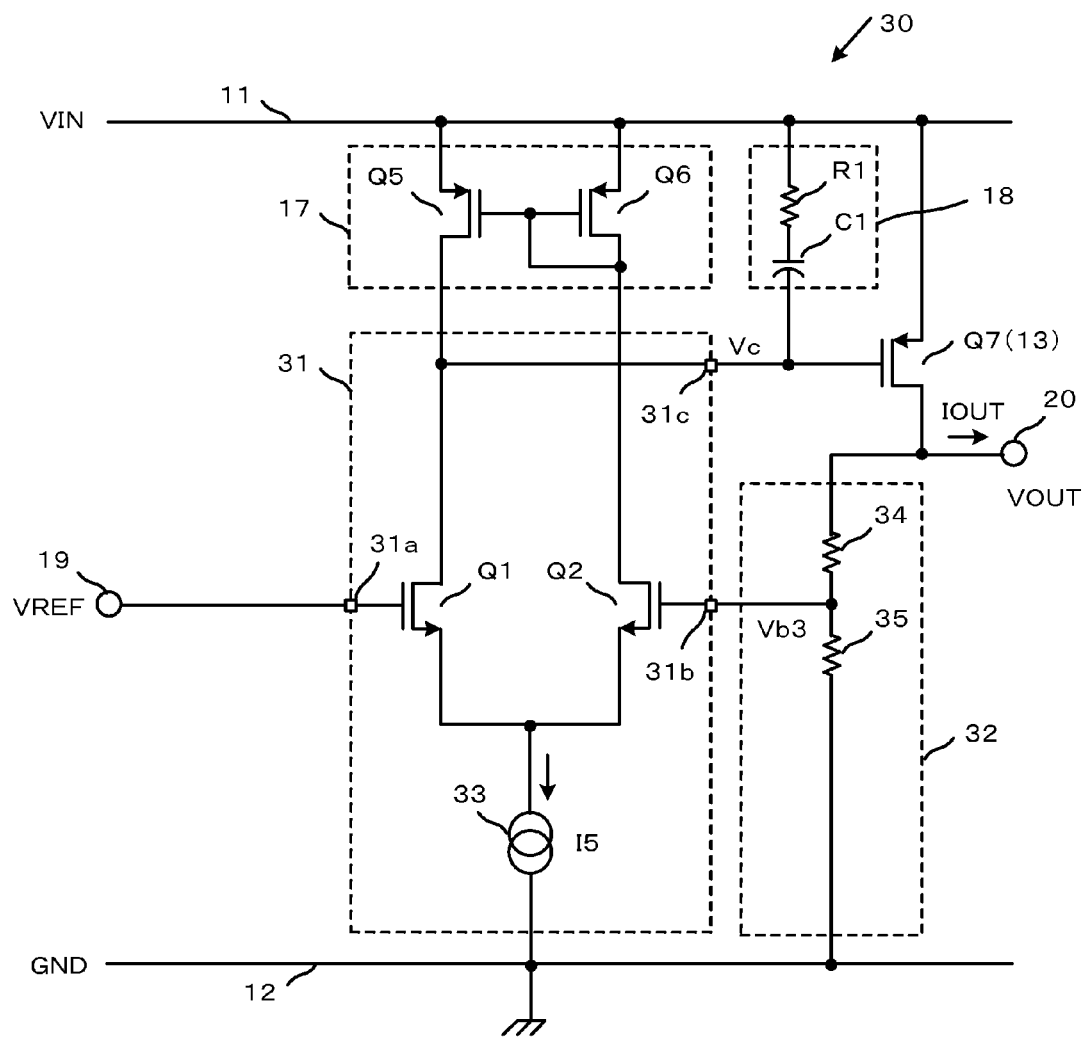
FIG. 4 is a circuit diagram showing a regulator of a comparative example in accordance with the first embodiment.

FIG. 4 is a circuit diagram showing a regulator of a comparative example. As shown in FIG. 4, the regulator 30 of the comparative example includes an output circuit 13, a differential circuit 31, a voltage-dividing circuit 32, and the current mirror circuit 17. The output circuit 13 and the current mirror circuit 17 have been described as above, and the description thereof will not be repeated.

The differential circuit 31 includes a non-inverting input terminal 31a, an inverting input terminal 31b, and an output terminal 31c. The differential circuit 31 further includes an NMOS transistor (a second transistor) Q1 and another NMOS transistor (a third transistor) Q2 being a pair of differential transistors, and a current supply 33. The current supply 33 drives the NMOS transistors Q1 and Q2 with a constant current I5.

The voltage-dividing circuit 32 is connected between the voltage output terminal 20 and the grounding line 12. The voltage-dividing circuit 32 outputs a voltage Vb3 obtained by dividing the output voltage Vout by resistances 34 and 35.

In the differential circuit 31, the reference voltage VREF is inputted into the non-inverting input terminal 31a, and the divided voltage Vd3 (feedback voltage) is inputted into the inverting input terminal 31b, so that a control voltage 31c is outputted to the output terminal 31c.

In the regulator 30 of the comparative example, a constant operating current I5 flows all of the time independently of the first and second steady states and the transient state. A large operating current I5 is necessary to enhance the transient response performance of the regulator 30.

In contrast, the regulator 10 of the embodiment has an operating current Ia1=I1+I2+I3+I4 in the first and second steady states or an operating current Ia2 in the transient state. The operating current Ia2 is larger than the operating current Ia1 by an absolute value of a difference between ΔIds4 and ΔIds3 shown in FIGS. 2D and 2E, and FIGS. 3D and 3E. Ia2 is expressed by the equation as $$Ia2=Ia1+|\Delta Ids4-\Delta Ids3|.$$

The regulator 30 of the comparative example needs to keep the operating current I5 as large as at least the operating current Ia2 in order to achieve the transient response performance of regulator 10 of the embodiment. As a result, power consumption increases in the regulator 30.

All that's required for the operating current Ia1 of the regulator 10 is that the differential circuit 14 is operable. This enables the operating current Ia1 of the regulator 10 to be much smaller than the operating current I5 of the regulator 30. Thus, the regulator 10 achieves low power consumption and a rapid response.

As described above, the regulator 10 of the embodiment has the differential circuit 14 with the X-configuration. As a result, the differential circuit 14 is enabled to increase the operating current only when the load varies, thereby enhancing the transient response performance. The regulator is therefore obtained with a little change in output voltage.

Figure 5:
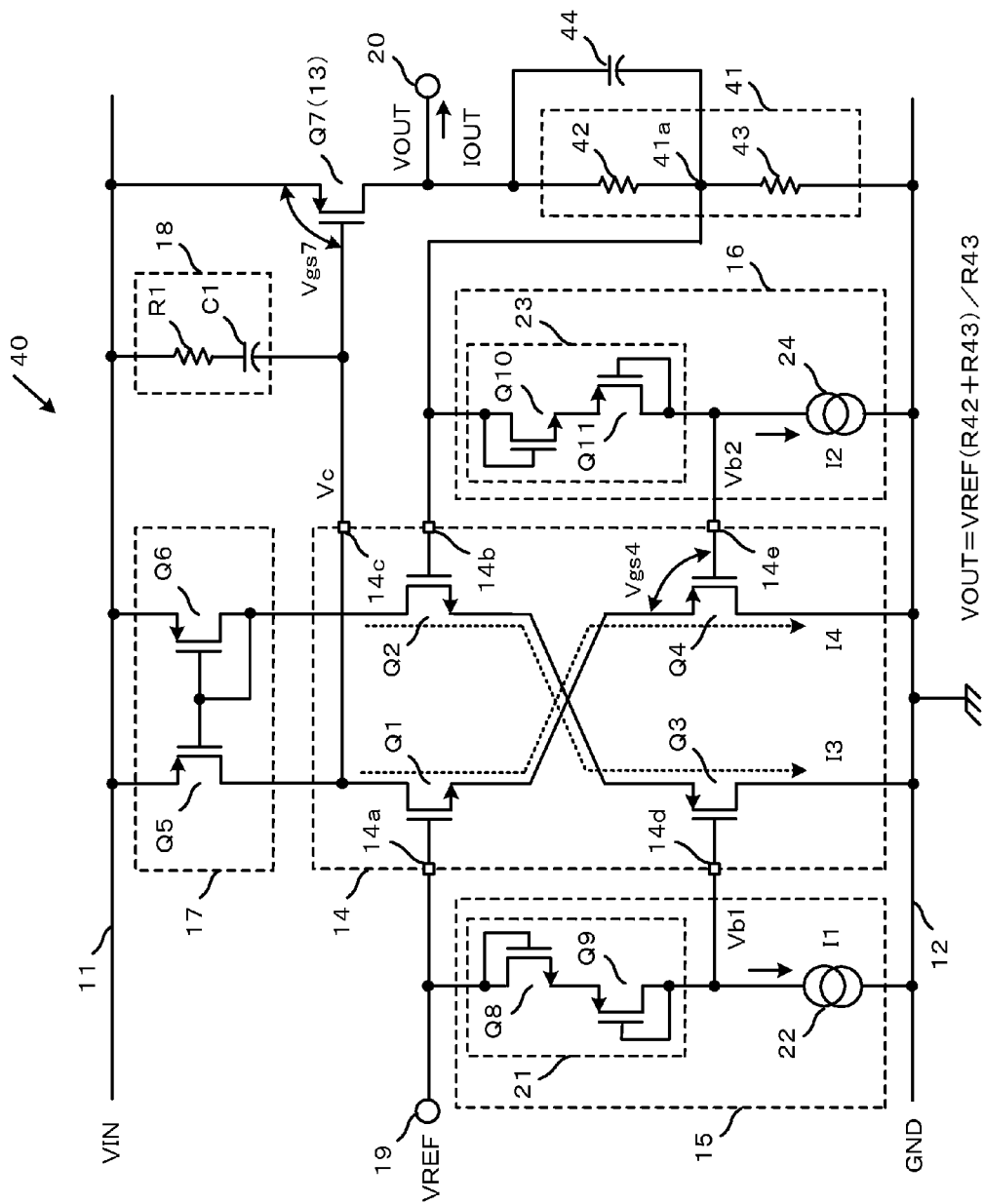
FIG. 5 is a circuit diagram showing another regulator in accordance with the first embodiment.

The embodiment describes a case that the reference voltage VREF and the output voltage VOUT are equal to each other. Alternatively, the reference voltage VREF and the output voltage VOUT may be different from each other. FIG. 5 is a circuit diagram showing a regulator with an output voltage VOUT higher than a reference voltage VREF.

As shown in FIG. 5, the regulator 40 includes a voltage-dividing circuit 41 connected between both the output terminal 20 and the grounding line 12. The voltage-dividing circuit 41 is a series circuit of the resistance 42 and the resistance 43. The voltage-dividing circuit 41 divides the output voltage VOUT by the resistance 42 and the resistance 43 to output a divided voltage from a connection node 41a of the resistance 42 and the resistance 43. A capacitor 44 for speeding up is connected between the output terminal 20 and the connection node 41a.

The inverting input terminal 14b of the differential circuit 14 is connected to the connection node 41a. The second bias circuit 16 is connected between the connection node 41a and the grounding line 12.

The output voltage VOUT of the regulator 40 is expressed as $$VREF(R42+R43)/R43.$$

R42 denotes the resistance value of the resistance 42, and R43 denotes the resistance value of the resistance 43.

The regulator 40 operates in the same way as the regulator 10, and the description will not be repeated.

Figure 6:
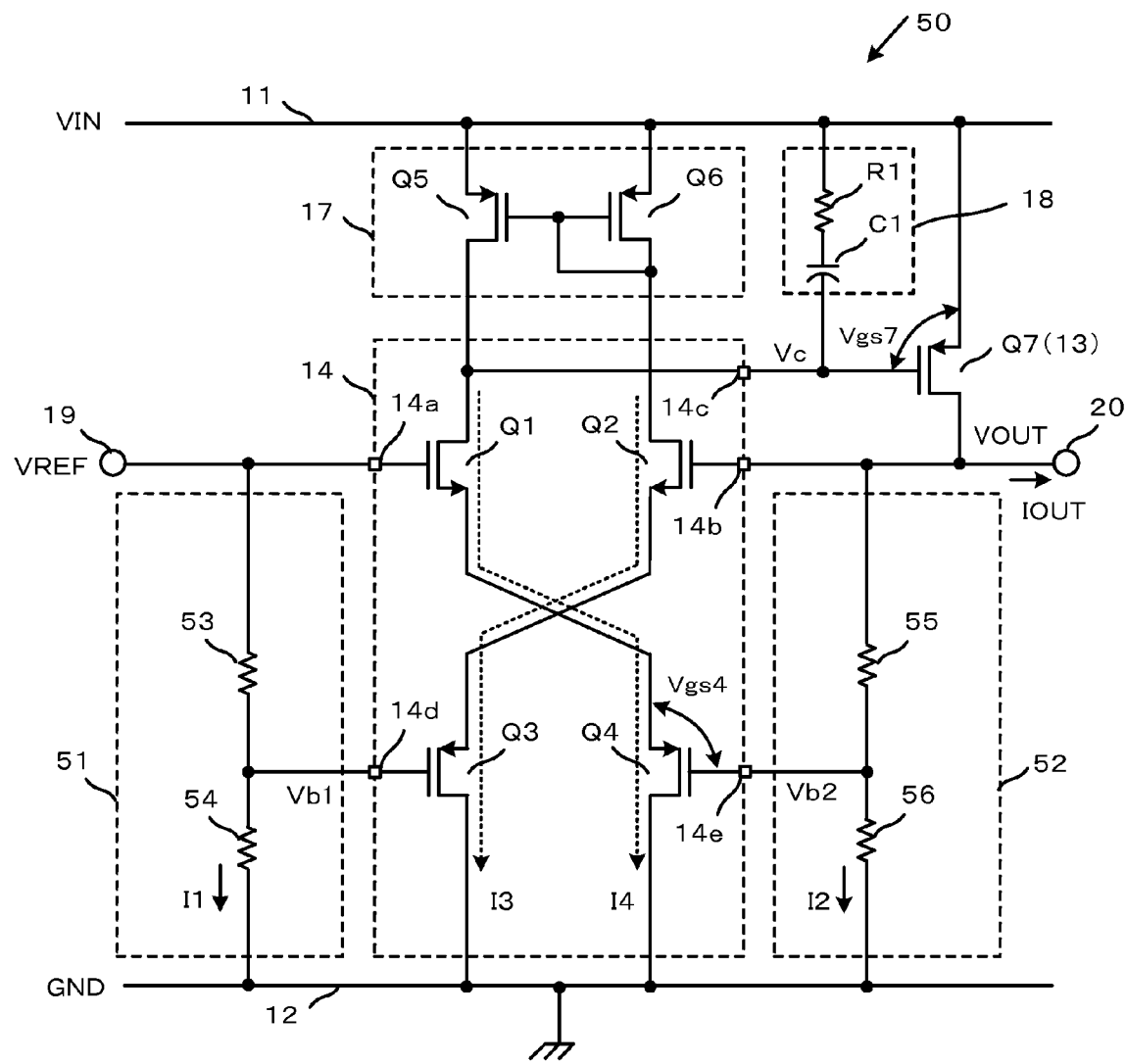
FIG. 6 is a circuit diagram showing another regulator in accordance with the first embodiment.

Both the first bias circuit 15 and the second bias circuit 16 have been described as a series circuit of the level-shift circuit and the current supply, but are not limited to the series circuit. FIG. 6 is a circuit diagram showing a regulator with first and second bias circuits that are resistance division circuits.

As shown in FIG. 6, the regulator 50 includes a first bias circuit 51 and a second bias circuit 52. The first bias circuit 51 is a series circuit of the resistance 53 and the resistance 54. The second bias circuit 52 is a series circuit of the resistance 55 and the resistance 56.

The first bias circuit 51 divides the reference voltage VREF by the resistance 53 and the resistance 54 to output a divided voltage to the first bias input terminal 14d. The first bias voltage Vb1 is therefore expressed by VREF R54/(R53+R54). R53 denotes the resistance value of the resistance 53, and R54 denotes the resistance value of the resistance 54.

In the same way, the second bias circuit 52 divides the output voltage VOUT by the resistance 55 and the resistance 56 to output a divided voltage to the second bias input terminal 14e. The second bias voltage Vb2 is expressed by VOUT R56/(R55+R56). R55 denotes the resistance value of the resistance 55, and R56 denotes the resistance value of the resistance 56.

The regulator 50 operates in the same way as the regulator 10, and the description of the regulator 50 will not be repeated.

Figure 7:
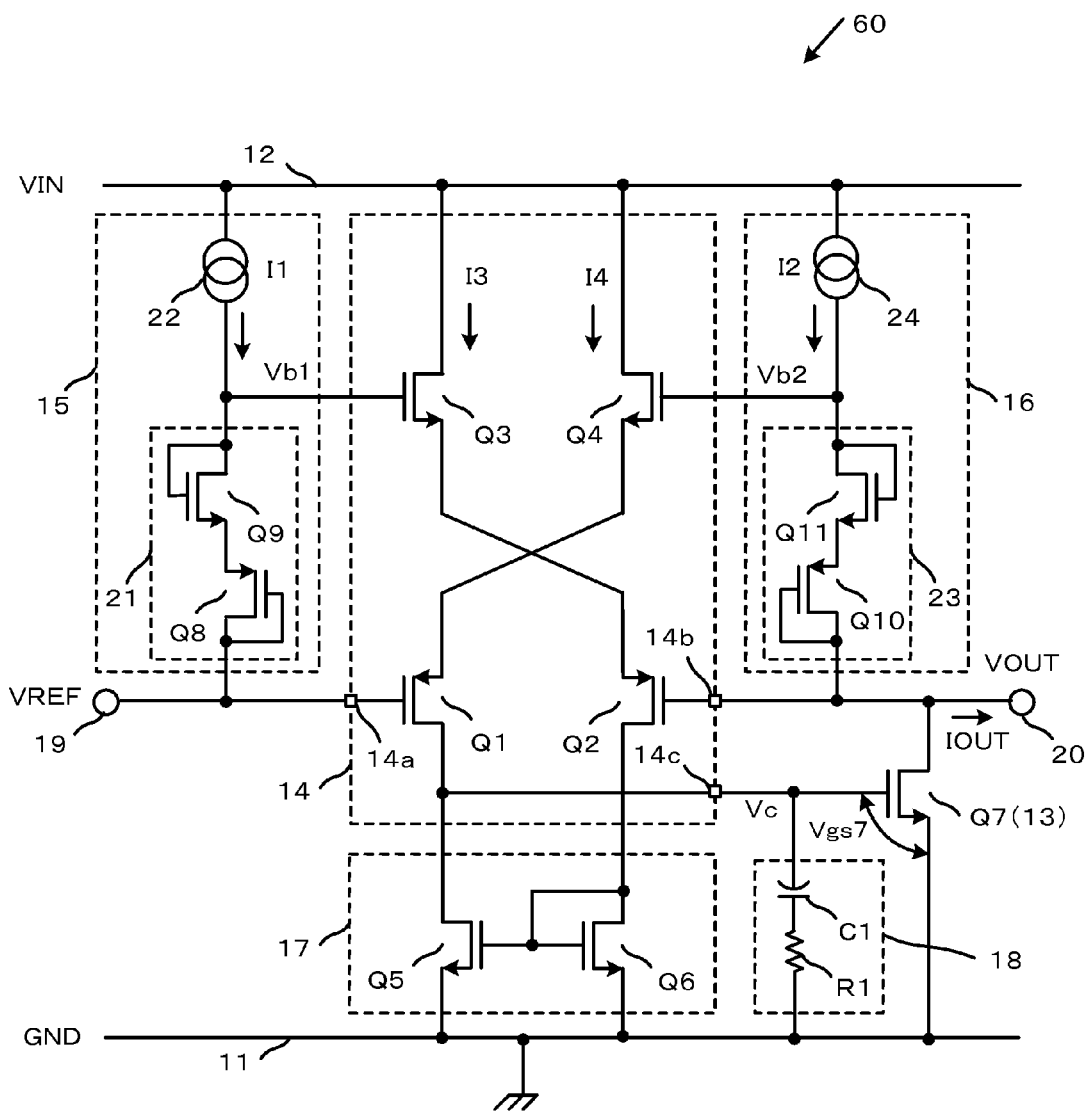
FIG. 7 is a circuit diagram showing another regulator in accordance with the first embodiment.

In the description of the embodiment, the first conductivity and second conductivity types correspond to p and n channels, respectively, and vice versa. FIG. 7 is a circuit diagram showing a regulator with first and second conductivity types that correspond to n and p channels, respectively.

As shown in FIG. 7, the regulator 60 includes NMOS transistors Q1, Q2, Q8, and Q10, PMOS transistors Q3, Q4, Q5, Q6, Q7, Q9, and Q11.

The regulator 60 is a circuit with a polarity opposite to that of the regulator 10. The regulator 60 operates in the same way as the regulator 10, and the description of the regulator 60 will not be repeated.

In the description of the embodiment, the transistors are of MOS type, and may be of bipolar type. A regulator employing bipolar transistors has a similar circuit to operate similarly to the regulator 10, and the description of such a regulator will not be repeated.

Second Embodiment

Figure 8:
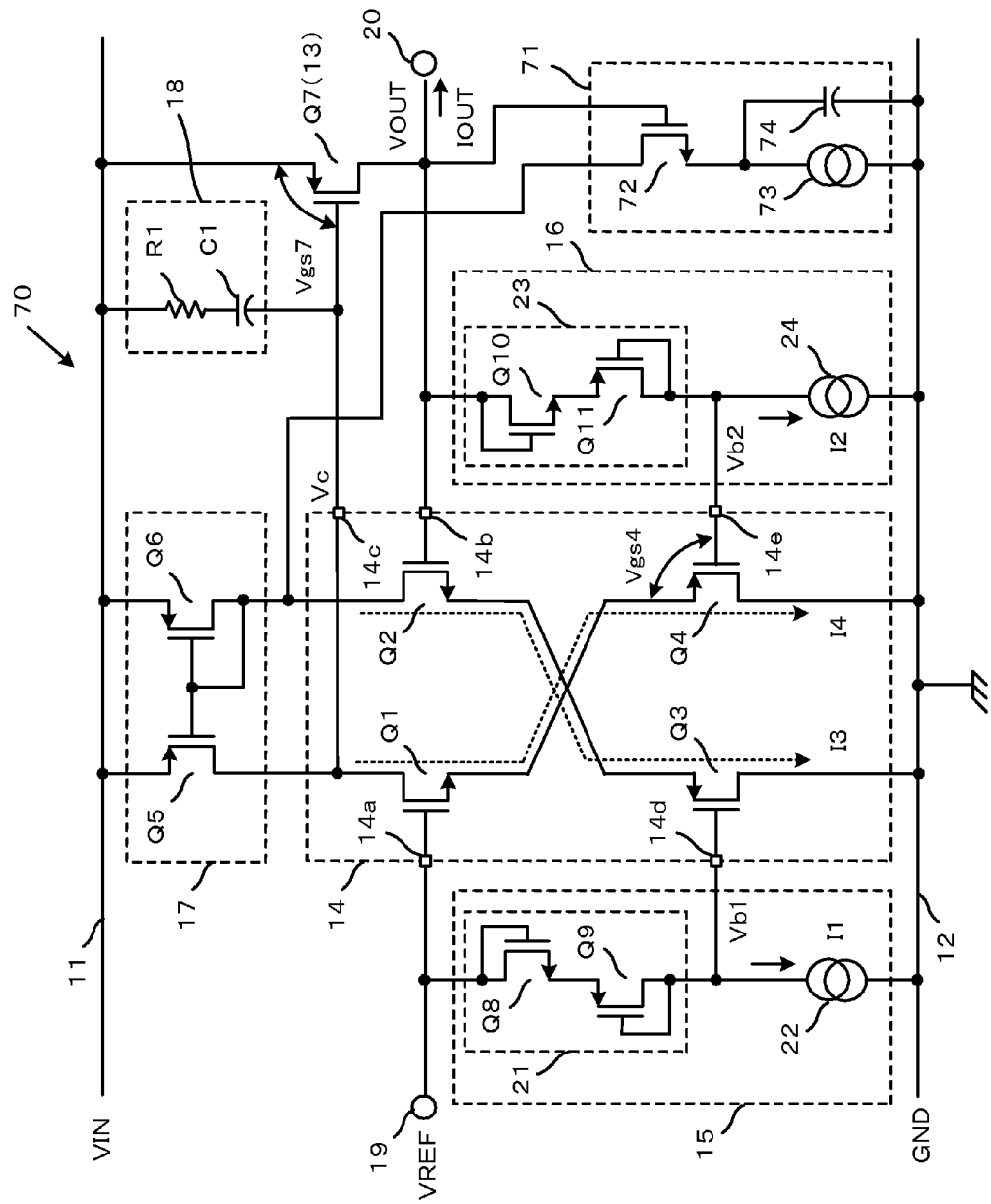
FIG. 8 is a circuit diagram showing a regulator in accordance with a second embodiment.

A regulator in accordance with a second embodiment will be described below with reference to FIG. 8, FIGS. 9A to 9E, and FIGS. 10A to 10G. FIG. 8 is a circuit diagram showing a regulator of the embodiment. FIGS. 9A to 9E make up a timing chart for describing the operation of the regulator when an output voltage VOUT of the regulator exhibits a small variation range. FIGS. 10A to 10G make up a timing chart for describing the operation of the regulator when the output voltage VOUT exhibits a large variation range.

Wherever possible, the same reference numerals or marks will be used to denote the same or like portions throughout figures, and the same description will not be repeated in the second embodiment. The second embodiment differs from the first embodiment in that a high-frequency circuit to improve high-frequency characteristics is added to the regulator in the second embodiment.

As shown in FIG. 8, the regulator 70 of the embodiment includes an NMOS transistor 72 (a sixth transistor), a third current supply 73, and a phase compensation capacitor 74. The NMOS transistor 72 is included in a high-frequency circuit 71 to improve the high-frequency characteristics. The NMOS transistor 72 amplifies a high-frequency signal superimposed on the output voltage VOUT. The third current supply 73 supplies operating current to the NMOS transistor 72. The phase compensation capacitor 74 enhances a performance of detecting the high-frequency signal superimposed on the output voltage VOUT.

The drain electrode of the NMOS transistor 72 is connected to the drain electrode of the NMOS transistor Q2, and the gate electrode of the NMOS transistor 72 is connected to the voltage output terminal 20. The third current supply 73 is connected between the source electrode of the NMOS transistor 72 and the grounding line 12. The phase compensation capacitor 74 is connected between the source electrode of the NMOS transistor 72 and the grounding line 12.

The NMOS transistor 72 amplifies a high-frequency signal superimposed on the output voltage VOUT. The third current supply 73 supplies operating current to the NMOS transistor 72. The phase compensation capacitor 74 accumulates electric charges in accordance with the high-frequency signal superimposed on the output voltage VOUT to control a current passing through the NMOS transistor Q2 (one of the pair of differential output lines 14f) via the NMOS transistor 72 in accordance with the charges accumulated.

Unfortunately, the regulator 10 shown in FIG. 1 has a low high-frequency gain, i.e., a slow response to high-frequency signals. In contrast, the regulator 70 is configured to have a high high-frequency gain, i.e., a fast response to high-frequency signals.

An alternating-current performance of the regulator 70 will be described below. A rapid increase in the output current due to a load variation causes a transient phenomenon to superimpose a high-frequency signal on the output voltage VOUT. The high-frequency signal superimposed on the output voltage VOUT is instantaneously transmitted to the gates of the NMOS transistor Q2 and the MOS transistor 72.

Electric charges have been preliminarily accumulated in the phase compensation capacitor 74 through the MOS transistor 72. The electric charges accumulated in the phase compensation capacitor 74 cause the source voltage of the NMOS transistor 72 to be constant, thereby decreasing the gate-source voltage Vgs72 of the NMOS transistor 72. This also decreases the drain current of the NMOS transistor 72.

A decrease in the output voltage VOUT decreases the gate voltage of the NMOS transistor Q2 and the drain current of the NMOS transistor 72 while decreasing the drain current of the NMOS transistor 72 much earlier than the drain current of the NMOS transistor Q2.

This accelerates an increase in the gate-source voltage Vgs7 of the PMOS transistor Q7 in the output circuit 13 to rapidly increase the drain current Ids7 of the PMOS transistor Q7.

A high-frequency signal superimposed on the output voltage VOUT causes the regulator 70 to control such that the high-frequency gain thereof increases. The controlling is so rapid that the regulator 70 with a wider bandwidth is enabled.

FIGS. 9A to 9E make up a timing chart for describing the operation of the regulator 70 for a small load variation in comparison with the regulator 10 of the first embodiment.

Figure 9:
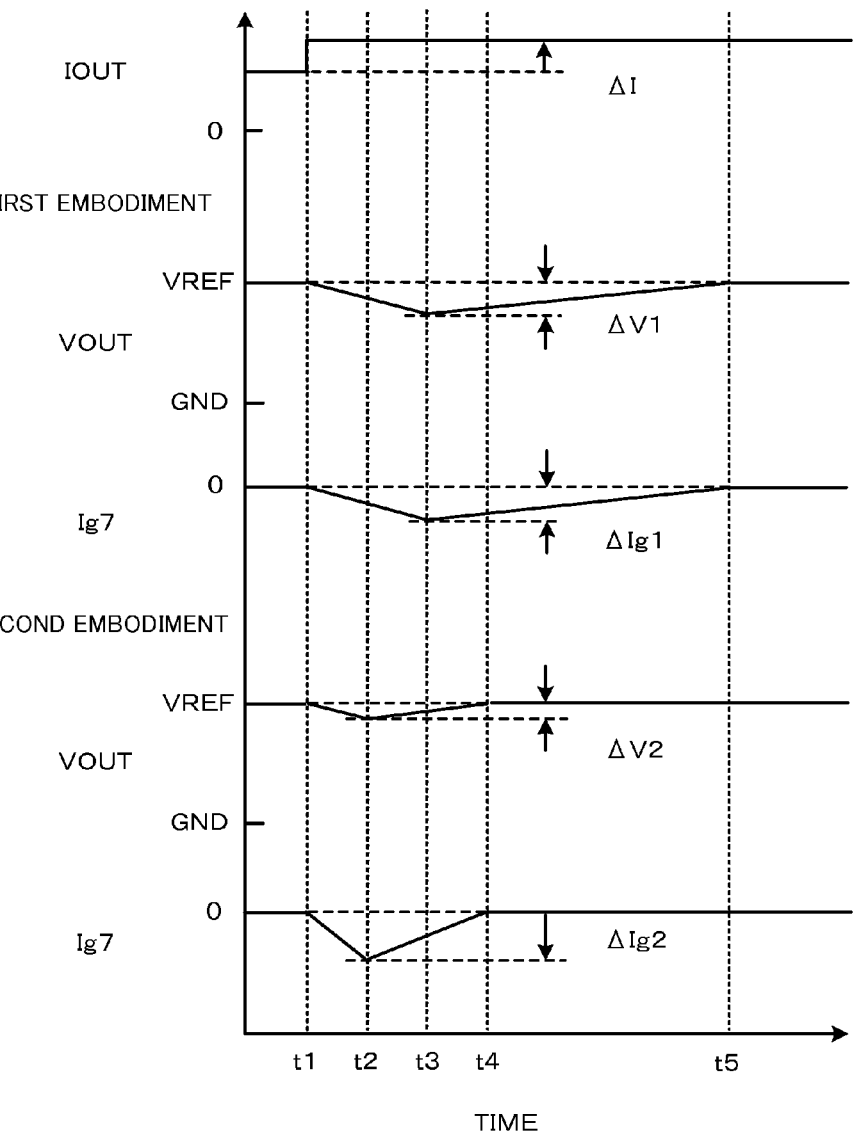
FIGS. 9A to 9E make up a timing chart for explaining operation of the regulator in accordance with the second embodiment.

FIG. 9A shows the output current IOUT. FIGS. 9B and 9C show the output voltage VOUT of the regulator 10 and the gate current Ig7 of the PMOS transistor Q7 in the output circuit 13 of the regulator 10, respectively, in accordance with the first embodiment. FIGS. 9A and 9B show substantially the same operation as FIGS. 2A and 2B.

FIGS. 9D and 9E show the output voltage VOUT of the regulator 70 and the gate current Ig7 of the PMOS transistor Q7 of the regulator 70, respectively, in accordance with the second embodiment.

As shown in FIG. 9A, an assumption is that the output current IOUT increases by ΔI in a stepwise manner as a result of the rapid increase in the load at the time t1. At this time, a high-frequency signal (not shown) is superimposed on the output voltage VOUT by a transient phenomenon due to the rapid increase in the output current IOUT.

In the regulator 70 of the embodiment, as shown in FIG. 9E, the high-frequency signal superimposed on the output voltage VOUT is instantaneously transmitted to the gates of the NMOS transistor Q2 and the MOS transistor 72, thereby allowing electric charges accumulated by the gate capacitance of the PMOS transistor Q7 to be extracted. The electric charges extracted flows as a gate current Ig7. The gate current Ig7 shows a peak (ΔIg2) at the time t2 in accordance with the electric discharge time constant of the gate capacitance to return to zero at the time t4.

As shown in FIG. 9D, the gate voltage decreases in accordance with the gate current Ig7, thereby increasing the gate-source voltage, and also increasing the drain current Ids7. The output voltage VOUT shows a peak (ΔV2) at the time t2 in accordance with the increase in the drain current Ids7, and reaches the reference voltage VREF at the time t4.

In contrast, the regulator 10 has a low high-frequency gain because of no high frequency circuit 71 therein. As a result, the high-frequency signal superimposed on the output voltage VOUT is instantaneously transmitted to the gate electrode of the NMOS transistor Q2 to result in only a gradual change in the gate current Ig7, as shown in FIG. 9C. The gate current Ig7 shows a peak (ΔIg1) at the time t3 after the time t2, and returns to zero at the time t5 after the time t4.

As shown in FIG. 9B, the output voltage VOUT shows a peak (ΔV1) at the time t3, and reaches the reference voltage VREF at the time t5.

The regulator 70 of the second embodiment has a relation expressed by ΔIg1<ΔIg2 and ΔV1>ΔV2 with the regulator 10 of the first embodiment. The regulator 70 of the second embodiment has a higher response speed than the regulator 10 of the first embodiment, thereby reducing a variation in the output voltage VOUT.

FIGS. 10A to 10G make up a timing chart showing the operation of the regulator 70 of the second embodiment in the case of a large load variation in comparison with the regulator 10 shown in FIG. 1 of the first embodiment and the regulator 30 shown in FIG. 4 of the comparative example.

Figure 10:
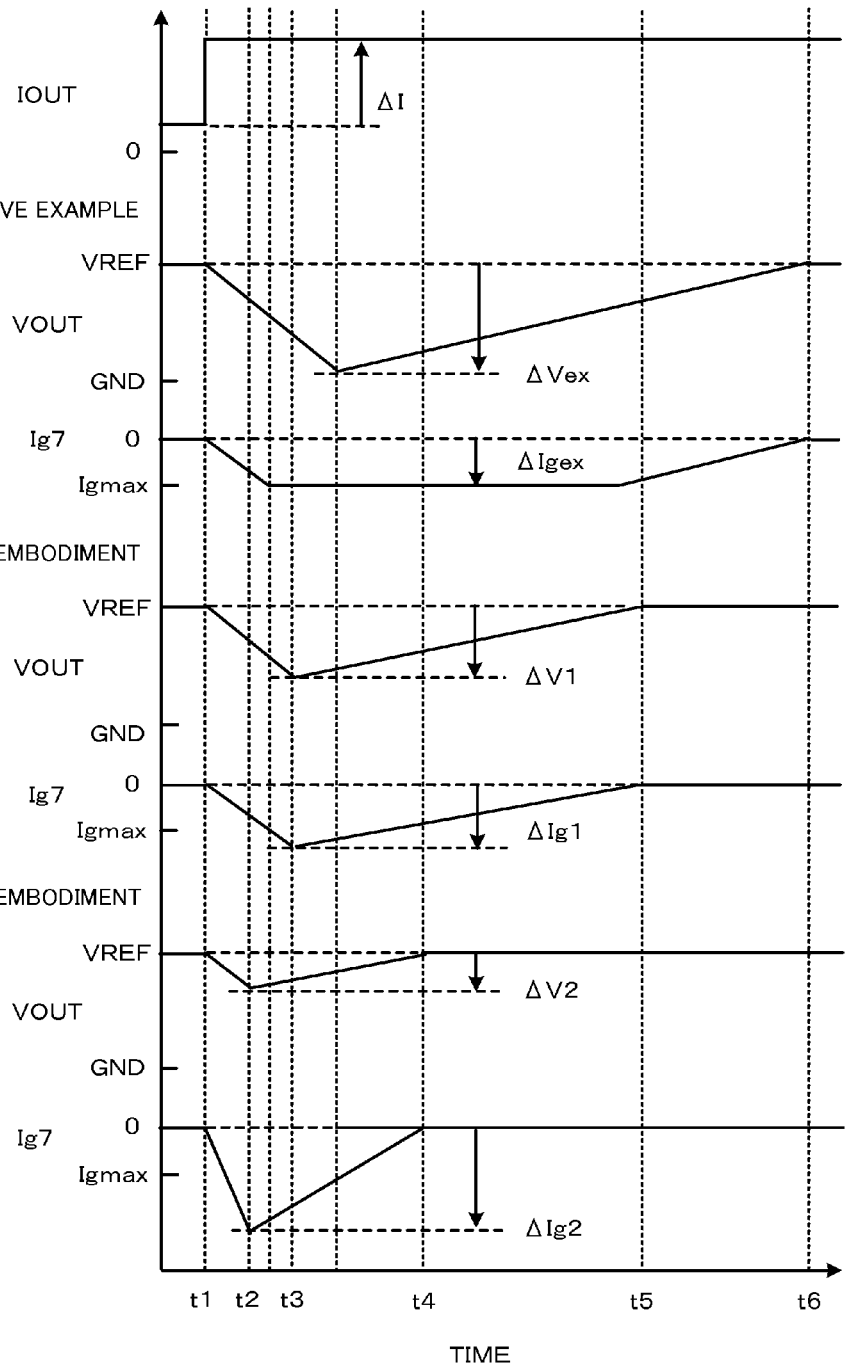
FIGS. 10A to 10G make up a timing chart for explaining operation of the regulator in accordance with the second embodiment.

FIG. 10A shows the output current IOUT. FIG. 10B shows the output voltage VOUT in the regulator 30 of the comparative example. FIG. 10C shows the gate current Ig7 of the PMOS transistor Q7 in the regulator 30 of the comparative example.

FIG. 10D shows the output voltage VOUT in the regulator 10 of the first embodiment. FIG. 10E shows the gate current Ig7 of the PMOS transistor Q7 in the regulator 10 of the first embodiment. FIGS. 10D and 10E shows substantially the same operation as FIGS. 9B and 9C.

FIG. 10F shows the output voltage VOUT in the regulator 70 of the second embodiment. FIG. 10G shows the gate current Ig7 of the PMOS transistor Q7 in the regulator 70 of the second embodiment. FIGS. 10F and 10G show substantially the same operation as FIGS. 9D and 9E.

The operation of the regulator 30 of the comparative example will be described below. As mentioned above, the regulator 30 of the comparative example always causes a constant current to pass through the differential circuit 31, and includes no high frequency circuit 71.

As shown in FIG. 10B, a decrease in the output voltage VOUT causes the gate current Ig7 to slowly change.

The gate current Ig7 has a limit (Igmax) determined by the operating current I5. Accordingly, the gate current Ig7 becomes saturated to reach Igmax (ΔIgex) when the gate current Ig7 reaches Igmax, e.g., between the time t2 and the time t3. This means that it takes a long time to extract electric charges accumulated by the gate capacitance of the PMOS transistor Q7.

The high-frequency signal superimposed on the output voltage VOUT is instantaneously transmitted to the gate electrode of the NMOS transistor Q2, but has a negligibly small influence on the operation because of the low gain to the high-frequency signal.

As shown in FIG. 10B, the output voltage VOUT shows a peak (ΔVex) between the time t3 and the time t4, and reaches the reference voltage VREF at the time t6 after the time t5.

The regulator 10 of the first embodiment and the regulator 70 of the second embodiment enable it to extract current through the NMOS transistor Q1 of the differential pair without limitations by the idling current I2 as described above, thereby allowing the gate current Ig7 to be larger than Igmax.

There is a relation of ΔIgex<ΔIg1<ΔIg2 and ΔV1>ΔV2>ΔVex between the regulator 70 of the second embodiment, the regulator 10 of the first embodiment, and the regulator 30 of the comparative example.

The regulator 70 of the embodiment achieves a small variation in the output voltage VOUT independently of the load variation.

As described above, the regulator 70 of the embodiment includes a high-frequency circuit 71 on the side of the inverting input terminal of the differential circuit 14. The high-frequency circuit 71 amplifies a high-frequency signal superimposed on the output voltage VOUT to control a current passing through the NMOS transistor Q2. The high frequency circuit 71 includes the NMOS transistor 72 for amplifying the high frequency signal and the phase compensation capacitor 74.

As a result, the high frequency circuit 71 enables it to instantaneously feed a high-frequency signal superimposed on the output voltage VOUT back to the gate electrode of the PMOS transistor Q7 to amplify the high-frequency signal. Thus, the regulator 70 with a wide band is obtained.

Adjusting parameters of the NMOS transistors Q1, Q2, 72, the PMOS transistors Q3, Q4, the phase compensation capacitor 74, the first to third current supplies 22, 24, and 73 enables it to eliminate a chance that the regulator oscillates at high frequencies without the phase compensation circuit 18.

Thus, the second embodiment eliminates the need for the phase compensation circuit 18, and is enabled to employ a ceramics capacitor as the output capacitor Cout.

In the above description, the high-frequency circuit 71 is provided on the side of the inverting input terminal of the differential circuit 14. Another high-frequency circuit may be additionally provided on the side of the non-inverting input terminal of the differential circuit 14, such that the regulator 70 symmetrically includes two high-frequency circuits.

Figure 11:
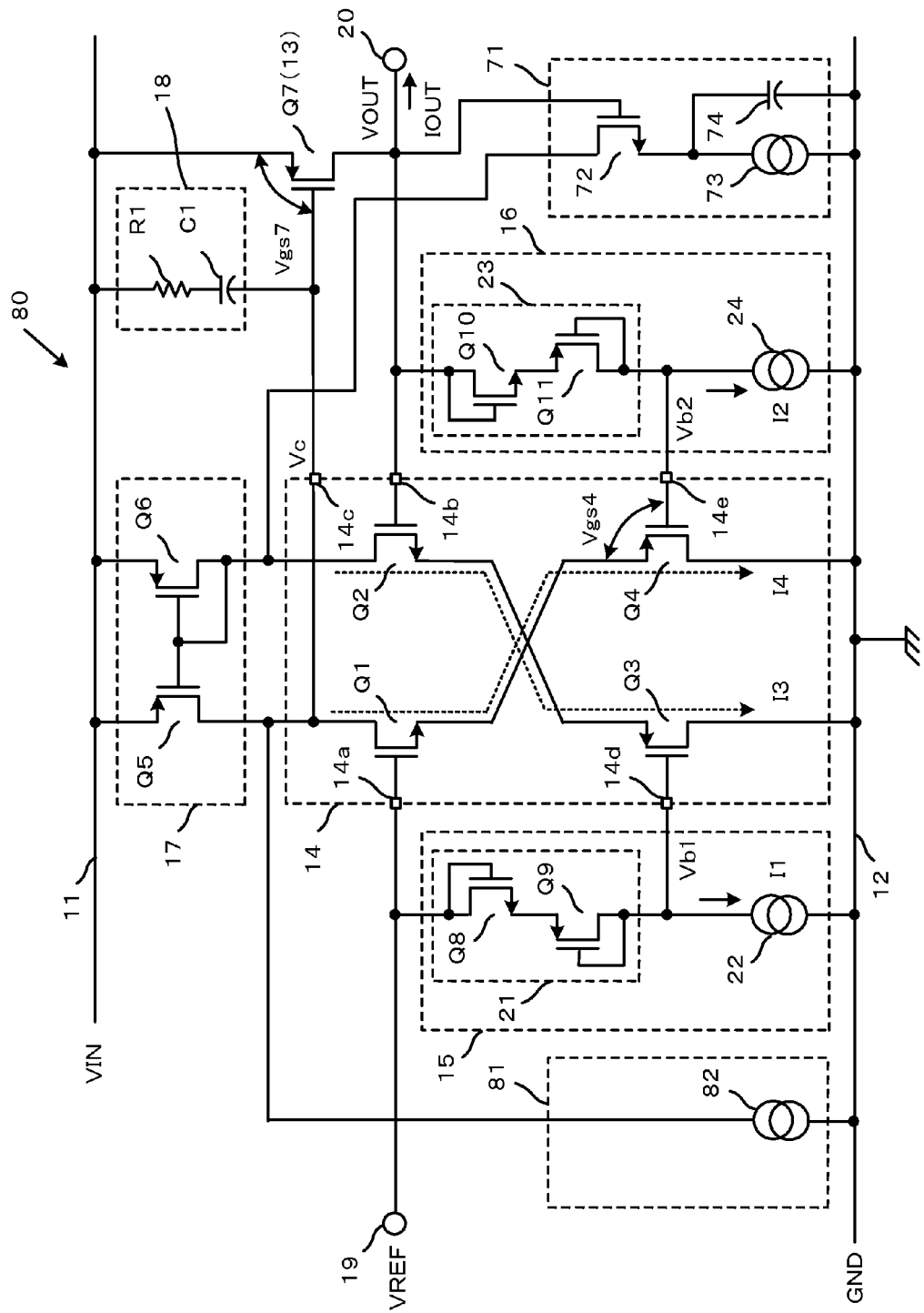
FIG. 11 is a circuit diagram showing another regulator in accordance with the second embodiment.
Figure 12:
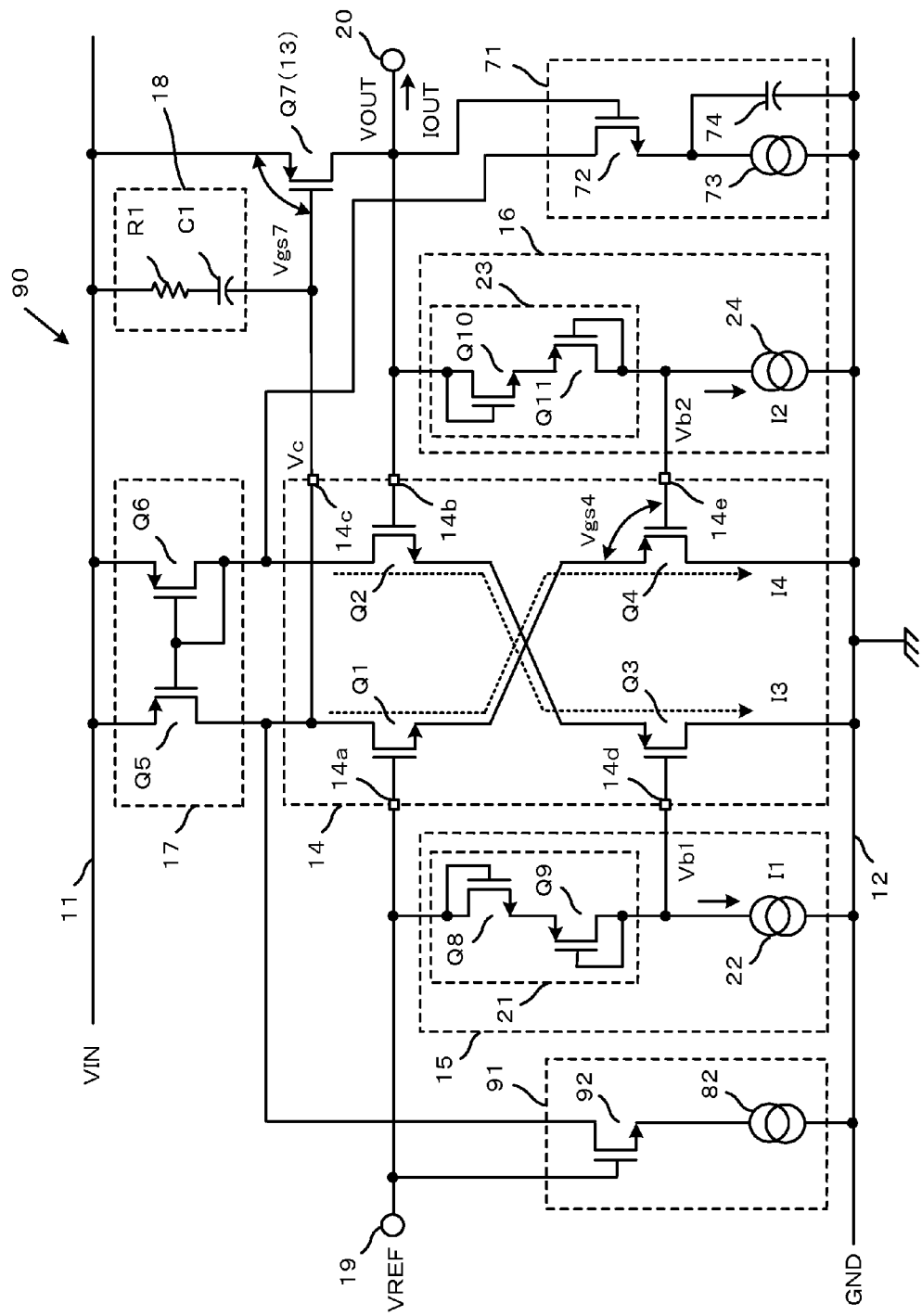
FIG. 12 is a circuit diagram showing another regulator in accordance with the second embodiment.

FIGS. 11 and 12 are circuit diagrams showing regulators with a symmetric configuration of two differential circuits 14 provided on both sides of the inverting and non-inverting input terminals.

As shown in FIG. 11, the regulator 80 includes a fourth current supply 82 as a high frequency circuit 81 provided on the non-inverting input terminal of the differential circuit 14. The fourth current supply 82 is connected between the drain electrode of the NMOS transistor Q1 and the grounding line 12.

Preferably, the fourth current supply 82 has the same electrical characteristics as the third current supply 73 to provide a symmetric property to the regulator 80. This causes a voltage between the source electrodes of the NMOS transistor Q1 and the PMOS transistor Q4 and a voltage between the source electrodes of the NMOS transistor Q2 and the PMOS transistor Q3 to be mostly equal to each other, thereby enabling the first to fourth current supplies 22, 24, 73, and 82 to have higher relative accuracy. The improved symmetry of the differential circuit 14 achieves a reduction in an offset voltage of the output voltage VOUT.

FIG. 12 is a circuit diagram showing a regulator with higher symmetry. As shown in FIG. 12, the regulator 90 is provided with another NMOS transistor for amplifying high frequency signals on the side of the non-inverting terminal of the differential circuit 14, thereby allowing the regulator 90 to be configured to have a lower offset voltage of the output voltage VOUT.

The regulator 90 includes a high frequency circuit 91 provided on the side of the non-inverting input terminal of the differential circuit 14. The high frequency circuit 91 includes an NMOS transistor 92 (a seventh transistor) connected between the fourth current supply 82 and the drain electrode of the NMOS transistor Q1.

The drain electrode of the NMOS transistor 92 is connected to the drain electrode of the NMOS transistor Q1, the source electrode of the NMOS transistor 92 is connected to the fourth current supply 82, and the gate electrode of the NMOS transistor 92 is connected to the reference voltage input terminal 19. The drain electrode of the NMOS transistor 92 is connected also to the gate electrode of the NMOS transistor Q1.

The gate voltage of the NMOS transistor 92 is the reference voltage VREF to provide a source voltage of the NMOS transistor 92 in accordance with the reference voltage VREF, thereby allowing a voltage between the fourth current supply 82 and the NMOS transistor 92 to be constant. This enhances the symmetry of the differential circuit 14 to reduce an offset voltage of the output voltage VOUT.

In order to adjust an offset voltage in the regulator 90 shown in FIG. 12, it is desirable that a size ratio of each of the transistors Q1 to Q4 may is modified. The size ratio is defined as a ratio L/W of the gate length L to the gate width W for each transistor. Alternatively, it is desirable that the size ratios of the pair of the PMOS transistors Q5, Q6 of the current-mirror circuit 17 are modified.

Third Embodiment

Figure 13:
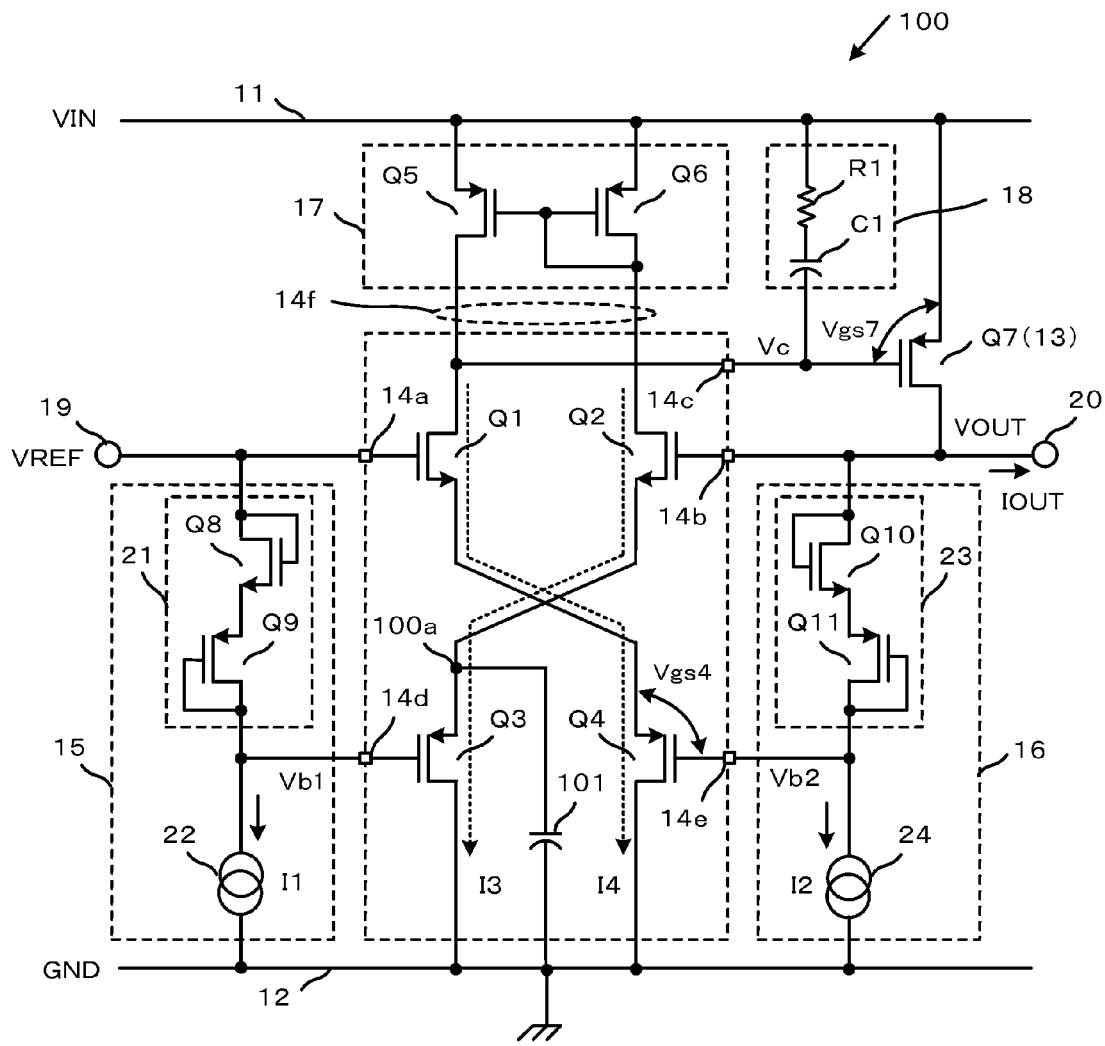
FIG. 13 is a circuit diagram showing a regulator in accordance with a third embodiment.

A regulator in accordance with a third embodiment will be described with reference to FIG. 13. FIG. 13 is a circuit diagram showing a regulator of the third embodiment.

Wherever possible, the same reference numerals or marks will be used to denote the same or like portions throughout figures, and the same description will not be repeated in the third embodiment. The third embodiment differs from the first embodiment in that a phase compensation capacitor is added to the regulator of the third embodiment to improve high-frequency characteristics.

The regulator 100 of the third embodiment includes the phase compensation capacitor 101 connected between a connection node 100a and the grounding line 12 to enhance sensitivity for the detection of high frequency components of the output voltage VOUT. The connection node 100a is on the wiring between the NMOS transistor Q2 and the PMOS transistor Q3.

The phase compensation capacitor 101 accumulates electric charges in accordance with the high frequency signal superimposed on the output voltage VOUT to control a current passing through the NMOS transistor Q2 (one of the pair of differential output lines 14f) in accordance with an amount of the electric charges accumulated therein.

An alternating-current performance of the regulator 70 will be described below. A rapid increase in the output current due to load variations causes a transient phenomenon to superimpose a high-frequency signal on the output voltage VOUT.

At this time, the gate voltage of the NMOS transistor Q2 decreases with a decrease in the output voltage VOUT whereas the high frequency signal superimposed on the output voltage VOUT is instantaneously transmitted to the gate electrode of the NMOS transistor Q2.

The phase compensation capacitor 101 has preliminarily accumulated electric charges through the NMOS transistor Q2. The electric charges accumulated in the phase compensation capacitor 101 causes the source voltage of the NMOS transistor Q2 to be constant, thereby reducing the gate-source voltage Vgs2 of the NMOS transistor Q2. This decreases the drain current of the NMOS transistor Q2.

Since the gate voltage of the PMOS transistor Q4 also decreases through the second level shift circuit 23, the gate-source voltage of the NMOS transistor Q1 increases through the PMOS transistor Q4. As a result, the drain current of the NMOS transistor Q1 increases.

The current mirror circuit 17 is connected to the respective drain electrodes (a pair of differential output lines 14f) of the NMOS transistors Q1 and Q2. This connection increases the gate-source voltage Vgs7 to increase the drain current of the PMOS transistor Q7 of the output circuit 13.

Thus, the regulator 100 controls a high-frequency signal gain such that the gain increases when the high frequency signal is superimposed on the output voltage VOUT. This controlling is so rapid that the regulator 100 with a wide band is achieved.

As described above, the regulator 100 of the third embodiment is provided with the phase compensation capacitor 101 on the side of the inverting input terminal 14. The phase compensation capacitor 101 allows the regulator 100 to instantaneously feed a high frequency signal superimposed on the output voltage VOUT back to the gate electrode of the PMOS transistor Q7 of the output circuit 13 to amplify the high frequency signal. Thus, the regulator 100 with a wide band is obtained.

In the above description, one terminal of the phase compensation capacitor 101 and one terminal of the output capacitor Cout are connected to the grounding line 12, but do not necessarily need to be connected to the grounding line 12.

One terminal of the phase compensation capacitor 101 and one terminal of the output capacitor Cout may be connected to a stable voltage pathway with low impedance to obtain the same effect.

The regulator 40 shown in FIG. 5 with the voltage dividing circuit 41 obtains the same effect. A speedup capacitor 44 is connected in parallel with the resistance 42 of the voltage dividing circuit 41. This allows the high frequency signal superimposed on the output voltage VOUT to be bypassed through the speedup capacitor 44 and subsequently to be instantaneously transmitted to the gate electrode of the MOS transistor Q2.

Fourth Embodiment

Figure 14:
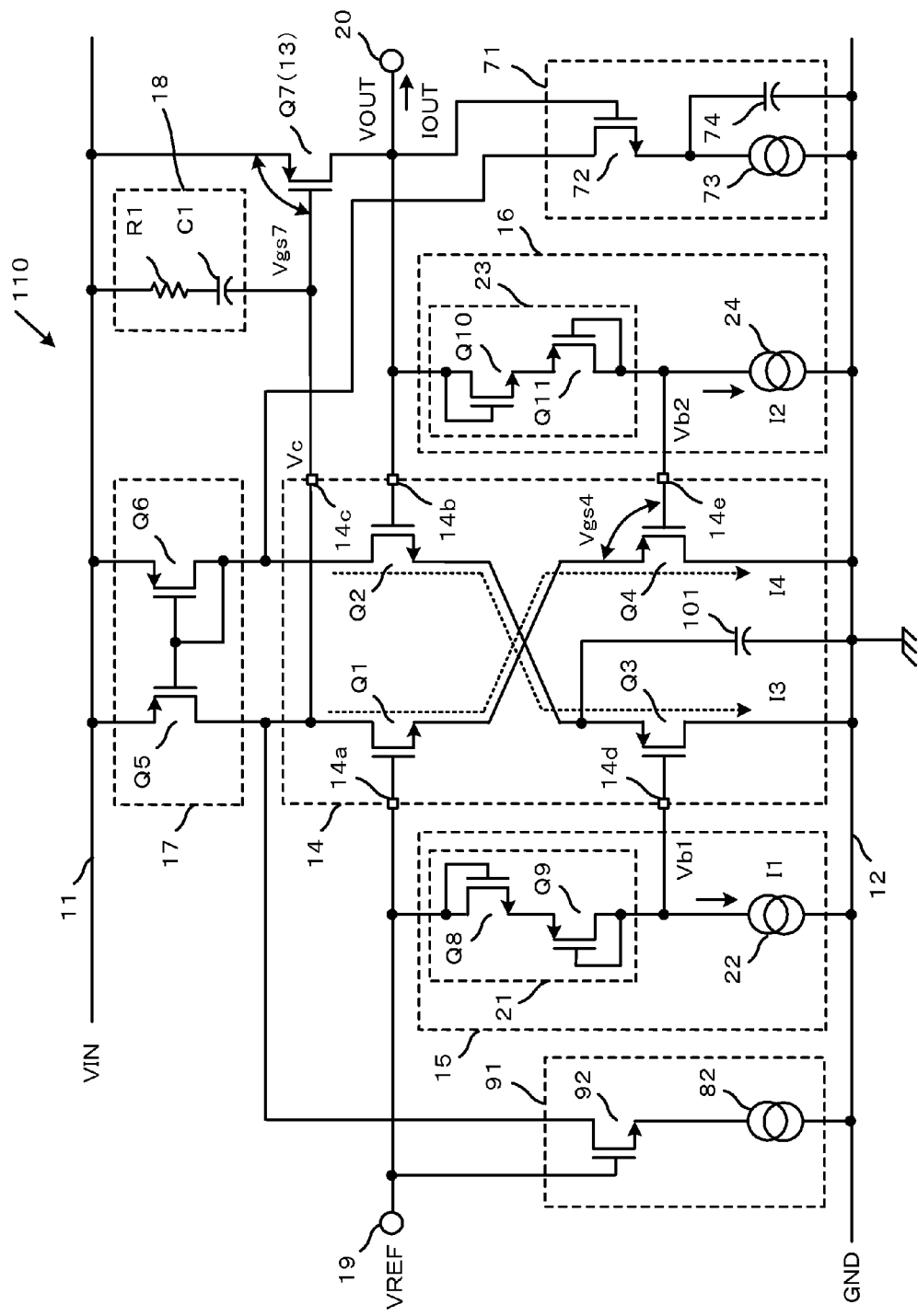
FIG. 14 is a circuit diagram showing a regulator in accordance with a fourth embodiment.

A regulator in accordance with a fourth embodiment will be described with reference to FIG. 14. FIG. 14 is a circuit diagram showing the regulator of the fourth embodiment. Wherever possible, the same reference numerals or marks will be used to denote the same or like portions throughout figures, and the same description will not be repeated in the fourth embodiment. The fourth embodiment differs from the first embodiment in that the regulator of the fourth embodiment includes both the high frequency circuit of the second embodiment and the high frequency circuit of the third embodiment.

As shown in FIG. 14, the regulator 110 of the embodiment is configured to combine the regulator 90 shown in FIG. 12 with the regulator 100 shown in FIG. 13. The configuration and operation of the regulator 110 will not be repeatedly described.

In the regulator 110 of the embodiment, the NMOS transistor 72 of the high frequency circuit 71 amplifies the high frequency signal superimposed on the output voltage VOUT, and the phase compensation capacitors 74 and 101 enhance the sensitivity for the high-frequency signal. Both the amplifying and the enhancing effects strengthen the controlling of the drain current of the NMOS transistor Q2.

As described above, the regulator 110 of the fourth embodiment is configured to have an enhanced gain for a high-frequency signal when the high-frequency signal is superimposed on the output voltage VOUT. Thus, the regulator 110 with a wide band is obtained.

Alternatively, the regulator of the fourth embodiment may combine the regulator 100 shown in FIG. 13 with the regulator 70 shown in FIG. 8 and the regulator 80 shown in FIG. 11.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A regulator, comprising:
a first transistor of a first conductivity type with a first control electrode, the first transistor configured to convert an input voltage into an output voltage, and output the output voltage lower than the input voltage;
a first bias circuit configured to generate a first bias voltage lower than a reference voltage;
a second bias circuit configured to generate a second bias voltage lower than a feedback voltage relating to the output voltage;
a differential circuit configured to output a comparison signal as a control signal to the first control electrode in accordance with a difference between the reference voltage and the output voltage, the differential circuit including a second transistor of a second conductivity type with a second control electrode, the reference voltage being inputted into the second control electrode, a third transistor of the second conductivity type with a third control electrode, the third transistor and the second transistor being a pair of differential transistors, the feedback voltage being inputted into the third control electrode, a fourth transistor of the first conductivity type with a fourth control electrode, the fourth transistor being complementarily connected to the second transistor, the second bias voltage being inputted into the fourth control electrode, and a fifth transistor of the first conductivity type with a fifth control electrode, the fifth transistor being complementarily connected to the third transistor, the first bias voltage being inputted into the fifth control electrode; and
a current mirror circuit connected to the second and third transistors.

2. The regulator according to claim 1, wherein
the first bias circuit includes a first level-shift circuit and a first current supply configured to supply current to the first level-shift circuit; and
the second bias circuit includes a second level-shift circuit and a second current supply configured to supply current to the second level-shift circuit.

3. The regulator according to claim 2, wherein
the first level-shift and second level-shift circuits each make up a series circuit of a diode-connected transistor of the first conductivity type and a diode-connected transistor of the second conductivity type.

4. The regulator according to claim 2, wherein
the first level shift circuit is connected to the second control electrode of the second transistor and the fifth control electrode of the fifth transistor; and
the second level shift circuit is connected to the third control electrode of the third transistor and fourth control electrode of the fourth transistor.

5. The regulator according to claim 1, further comprising:
a sixth transistor of the second conductivity type to amplify a high-frequency signal, and to supply the high-frequency signal amplified to one of the second and third transistors, the high-frequency signal being superimposed on the output voltage;
a third current supply configured to supply current to the sixth transistor; and
a capacitor connected in parallel with the third current supply, to accumulate electric charges in accordance with the high-frequency signal and to control current passing through one of the second and third transistors through the sixth transistor in accordance with the electric charges accumulated.

6. The regulator according to claim 5, further comprising a fourth current supply connected to the other of the second and third transistors.

7. The regulator according to claim 6, further comprising
a seventh transistor of the second conductivity type with a seventh control electrode, being connected between the other of the second and third transistors and the fourth current supply, the reference voltage being inputted into the seventh control electrode.

8. The regulator according to claim 1, further comprising
a capacitor connected to a connection node, the connection node being on a wiring between the third transistor and the fifth transistor.

9. The regulator according to claim 7, further comprising:
a capacitor connected to a connection node, the connection node being on a wiring between the third transistor and the fifth transistor.

10. The regulator according to claim 1, wherein
the first conductivity type is of p type, and the second conductivity type is of n type.

11. The regulator according to claim 1, wherein
the first conductivity type is of n type, and the second conductivity type is of p type.

12. The regulator according to claim 1, wherein
the first to fifth transistors are of an insulated gate field effect transistor type, or of a bipolar transistor type.

13. The regulator according to claim 1, wherein
the first bias circuit is a series circuit of a first resistance and a second resistance, and the second bias circuit is a series circuit of a third resistance and a fourth resistance.

14. The regulator according to claim 13, wherein
the first resistance is connected between the second control electrode of the second transistor and the fifth control electrode of the fifth transistor, and the third resistance is connected between the third control electrode of the third transistor and the fourth control electrode of the fourth transistor.

15. The regulator according to claim 1, wherein
the feedback voltage relating to the output voltage is a voltage obtained by dividing the output voltage by resistance.

16. A regulator, comprising:
a first transistor of a first conductivity type with a first control electrode, the first transistor configured to convert an input voltage into an output voltage, and output the output voltage lower than the input voltage;
a first bias circuit configured to generate a first bias voltage lower than a reference voltage;
a second bias circuit configured to generate a second bias voltage lower than a feedback voltage relating to the output voltage;
a differential circuit to output a comparison signal as a control signal to the first control electrode in accordance with a difference between the reference voltage and the output voltage, the differential circuit including a second transistor of a second conductivity type with a second control electrode, the reference voltage being inputted into the second control electrode, a third transistor of the second conductivity type with a third control electrode, the third transistor and the second transistor being a pair of differential transistors, the feedback voltage being inputted into the third control electrode, a fourth transistor of the first conductivity type with a fourth control electrode, the fourth transistor being complementarily connected to the second transistor, the second bias voltage being inputted into the fourth control electrode, and a fifth transistor of the first conductivity type with a fifth control electrode, the fifth transistor being complementarily connected to the third transistor, the first bias voltage being inputted into the fifth control electrode;

a current mirror circuit connected to the second and third transistors;

a sixth transistor of the second conductivity type to amplify a high-frequency signal and to supply the high-frequency signal amplified to one of the second and third transistors, the high-frequency signal being superimposed on the output voltage;

a third current supply configured to supply current to the sixth transistor; and a capacitor connected in parallel with the third current supply, to accumulate electric charges in accordance with the high-frequency signal and to control current passing through one of the second and third transistors through the sixth transistor in accordance with the electric charges accumulated.

17. The regulator according to claim 16, further comprising a fourth current supply connected to the other of the second and third transistors.

18. The regulator according to claim 17, further comprising a seventh transistor of the second conductivity type with a seventh control electrode, being connected between the other of the second and third transistors and the fourth current supply, the reference voltage being inputted into the seventh control electrode.

19. The regulator according to claim 16, further comprising a capacitor connected to a connection node, the connection node being on a wiring between the third transistor and the fifth transistor.

20. The regulator according to claim 18, further comprising a capacitor connected to a connection node, the connection node being on a wiring between the third transistor and the fifth transistor.

* * * * *